United States Patent
Pike et al.

(10) Patent No.: US 6,420,097 B1
(45) Date of Patent: Jul. 16, 2002

(54) HARDMASK TRIM PROCESS

(75) Inventors: Christopher L. Pike, Fremont; Scott A. Bell, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/562,659

(22) Filed: May 2, 2000

(51) Int. Cl.[7] .................................................. G03F 7/36
(52) U.S. Cl. ........................ 430/313; 430/317; 430/322; 430/328
(58) Field of Search ................................ 430/313, 317, 430/322, 328

(56) References Cited

U.S. PATENT DOCUMENTS

| | | |
|---|---|---|
| 5,139,904 A | 8/1992 | Auda |
| 5,324,676 A * | 6/1994 | Guterman .................... 437/43 |
| 5,431,770 A | 7/1995 | Lee |
| 5,804,088 A | 9/1998 | McKee |
| 5,885,887 A * | 3/1999 | Hause et al. ................. 438/564 |
| 5,930,634 A * | 7/1999 | Hause et al. ................. 438/307 |
| 5,965,461 A | 10/1999 | Yang et al. |
| 6,020,111 A * | 2/2000 | Mihara ........................ 430/318 |
| 6,121,123 A * | 9/2000 | Lyons et al. ................. 438/585 |
| 6,156,485 A * | 12/2000 | Tang et al. .................. 430/313 |
| 6,194,323 B1 * | 2/2001 | Downey et al. ............. 438/717 |
| 6,277,750 B1 * | 8/2001 | Pawlowski et al. ......... 438/689 |
| 6,281,130 B1 * | 8/2001 | Pike ............................ 438/693 |

* cited by examiner

Primary Examiner—Janet Baxter
Assistant Examiner—Amanda C. Walke
(74) Attorney, Agent, or Firm—Davis Chin

(57) ABSTRACT

An improved method of forming circuit structures having linewidths which are smaller than what is achievable by conventional UV lithographic techniques on ultra-thin resist layers is provided. The method includes a hardmask which is patterned using an ultra-thin resist layer and is then trimmed to reduce the width of the hardmask before etching the underlying gate conductive layer.

17 Claims, 3 Drawing Sheets

HARDMASK TRIM PROCESS

BACKGROUND OF THE INVENTION

This invention relates generally to manufacturing processes for fabricating semiconductor integrated devices. More particularly, it relates to an improved method of forming circuit structures having linewidths which are smaller than what is achievable by conventional UV lithographic technology on ultra-thin resist layers.

As is generally known to those in the semiconductor industries, there is a continuing trend of manufacturing semiconductor integrated circuits with higher and higher densities on a smaller chip area. As a consequence of this desire for large scale integration, this has led to a continued shrinking of the circuit dimensions and features of the devices so as to reduce manufacturing costs and to improve circuit functionality. The ability to reduce the size structures such as shorter gate lengths in field-effect transistors is driven by lithographic technology which is, in turn, dependent upon the wavelength of light used to expose the photoresist. Currently, optical steppers expose the photoresist using light having a wavelength of 248 nm is widely used in manufacturing, but a radiation having a wavelength of 193 nm is being experimented in research and development laboratories. Further, the next generation lithographic technologies will in all likelihood progress toward a radiation having a wavelength of 157 nm and even shorter wavelengths, such as those used in Extreme Ultra-Violet (EUV) lithography (≈13 nm).

As the wavelength of the radiation decreases, such classic image exposure techniques cannot be used to satisfactorily generate the pattern linewidths in the photoresist of less than 0.25 μm (2500 Å). This is due to the fact that the organic-based photoresist materials will become increasingly opaque to the radiation. In order to overcome this drawback, there has been developed in recent years of using ultra-thin resist (UTR) coatings in order to maintain the desired characteristics of the masked photoresist structures (e.g., near vertical sidewalls for the resist profiles, maximum exposure/focus latitude). In the current state-of-the-art, integrated circuit manufacturers have been using in the resist process a resist coating having a standard photoresist thickness of more than 0.5 μm (5,000 Å) for 248 nm lithography and 0.4 μm (4,000 Å) for 193 nm lithography. Thus, a resist coating having an UTR thickness is considered to be resist films of less than 0.25 μm (2500 Å) in thickness.

However, the use of UTR coating is not without any problems. The use of UTR coating suffer from the disadvantage that during the etch process the films being etched often do not scale down as rapidly as the thickness of the resist coating. In addition, even when such films can be scaled down or the selectivity of the etch process can be improved, the increasing use of trim (controlled line width reduction) process can fully consume the etch process margin for the underlying film. Thus, it has been recognized that a major problem to date of using UTR coating is related to etching underlying films when used with trim processes.

Accordingly, there is still a need of providing a fabrication process for forming circuit structures smaller than the capability of the lithographic technology while using ultra-thin resist processes. This is achieved in the present invention by utilizing a hardmask which is patterned using resist and is then trimmed so as to reduce the linewidth of the hardmask before etching the underlying film.

SUMMARY OF THE INVENTION

Accordingly, it is a general object of the present invention to provide an improved method of forming circuit structures having linewidths which are smaller than what is achievable by conventional UV lithographic technology on ultra-thin resist layers.

In accordance with a preferred embodiment of the present invention, there is provided an improved method of forming circuit structures having linewidths which are smaller than the capabilities of typical UV lithographic techniques on ultra-thin resist layers. A semiconductor wafer stack is provided which is formed of a substrate and a gate conductive layer above the substrate. A hardmask layer is deposited over the gate conductive layer. An ultra-thin resist layer is then deposited over the hardmask layer.

A resist mask is formed which has an initial linewidth. The hardmask layer is isotropically over-etched to form a hardmask having a final linewidth which is narrower than the initial linewidth of the resist mask and corresponds to a desired gate linewidth. The gate conductive layer as defined by the hardmask is anisotopically etched to form a gate having a width substantially equal to the final linewidth of the hardmask.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

A major concern in the conventional UV lithographic process associated with ultra-thin resist layers is that trimming of such resist films will not leave sufficient amount of material to completely etch the underlying film. The purpose of this invention is to provide an improved method of forming circuit structures having linewidths which are smaller than what is achievable by the conventional UV lithographic techniques on ultra-thin resist layers.

Before describing in detail the improved method of forming circuit structures having smaller linewidths of the instant invention, it is believed that it would be helpful in understanding the principles of the present invention and to serve as a background by first explaining the conventional lithographic process used on a standard resist having a thickness of about 5000 Å for forming a gate conductor with reference to FIGS. 1(a) through 1(d). Further, the problem associated when the conventional lithographic process is applied to an ultra-thin resist thickness of less than 2500 Å will also be explained in connection with FIGS. 2(a) through 2(d).

Figure 1A:
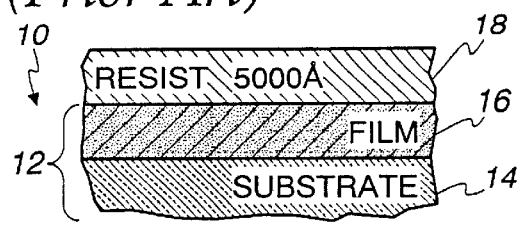
FIGS. 1(a)–1(d) illustrate cross-sectional views of a conventional lithographic process utilizing a standard resist having a thickness of about 5000 Å.

In FIG. 1(a), there is shown a portion 10 of a semiconductor device being fabricated on a semiconductor wafer. The portion 10 includes a semiconductor wafer stack or film stack 12 formed of a substrate 14 and a gate conductive layer or film 16. A resist layer 18 is deposited on top of the gate conductive layer 16. Typically, the gate conductive layer 16 is a layer of polycrystalline silicon having a thickness between 500 Å to 5000 Å. The resist layer has a thickness of approximately 5000 Å in the current art.

Figure 1B:
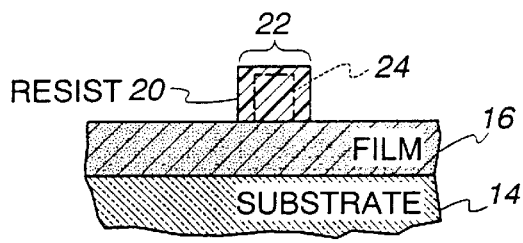

In FIG. 1(b), the resist layer 18 is patterned to an initial resist mask 20 which has an initial linewidth 22. The initial linewidth 22 is assumed to be the smallest dimension obtained by image transfer from the resist layer in the lithographic equipment. Since it is desired to define and control the gate linewidth to be smaller than this initial linewidth 22, a trim etch process is used so as to further reduce the initial linewidth 22 to match the desired gate line width.

For example, a typical deep-UV stepper can produce a reliable resolution capability down to approximately 0.25 $\mu$m. In order to decrease the gate linewidth to be less than 0.25 $\mu$m, the initial linewidth 22 is controllably etched until the desired gate linewidth is achieved. The trim etch process includes isotopically etching away a portion (the area outside of the dotted line 24) of the resist mask 20 so as to reduce simultaneously the thickness with the lateral dimension until a final resist mask 26 is obtained. This is depicted in FIG. 1(c) in which a final linewidth 28 is produced corresponding to approximately the desired gate linewidth.

Figure 1C:
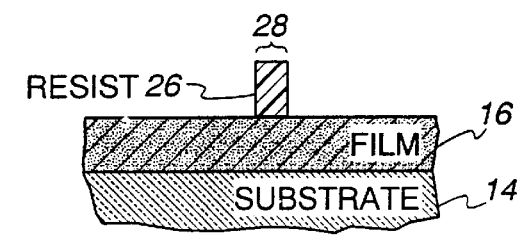
Figure 1D:
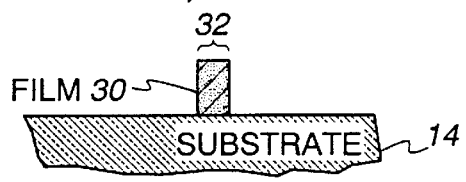
Figure 2D:
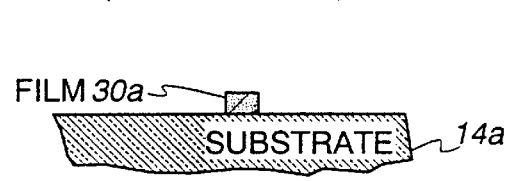

In FIG. 1(d), there is shown a gate conductive etching process in which exposed portions of the gate conductive layer 16 are etched away. The gate conductive etching process includes an anisotropical etching process with the resist as an etchmask so as to remove the exposed portions of the conductive layer 16 and is stopped on the substrate 14. As a result, after the isotropic etch and the removal of the final resist mask 26, a gate 30 is formed which has a width 32 substantially equal to the final linewidth 28 of the resist.

Figure 2A:
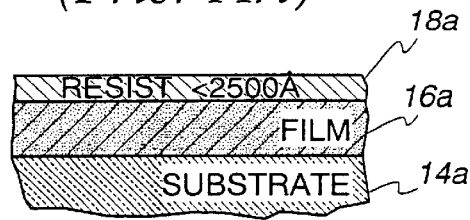
FIGS. 2(a)–2(d) illustrate the problem of applying the conventional lithographic process of FIGS. 1(a)–1(d) to an UTR having a thickness of less than 2500 Å.
Figure 2B:
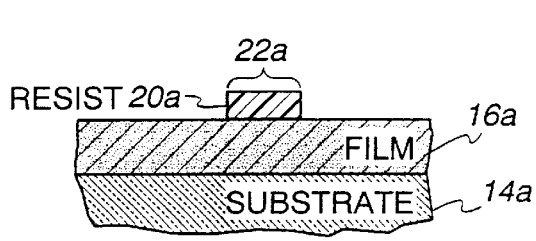

However, when the lithographic process described above in FIGS. 1(a)–1(d) is applied to an UTR thickness of less than 2500 Å, there is created a significant problem in the gate conductor etching process since an excessive amount of resist will have been consumed during the trim process step. As can be seen in FIG. 2(a), an UTR layer 18a has a thickness of less than 2500 Å as compared to the thicker resist layer 18 of FIG. 1(a). In FIG. 2(b), the UTR layer 18a is patterned to an initial resist mask 20a which has an initial linewidth 22a. It will be noted that the initial resist mask 20a has a thickness which is substantially less than the resist mask 20 of FIG. 1(b).

Figure 2C:
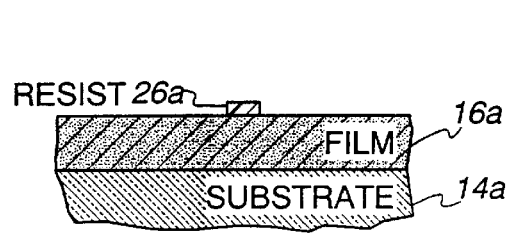

Thus, during the isotropic etching (trim process) of the UTR layer 18a in FIG. 2(b) so as to reduce the initial linewidth, an excessive amount of the resist will be consumed leaving a smaller final resist mask 26a in FIG. 2(c) as compared to the resist mask 26 of FIG. 1(c). As a result, during the isotropic etch of the gate conductor layer 16a an undesired consumption of the same will occur leaving only a small gate 30a in FIG. 2(d) as compared to the gate 30 of FIG. 1(d).

In order to solve this problem, the inventors of the present invention have developed an improved method of forming gates having linewidths which are smaller than what is achievable by conventional UV lithographic techniques on ultra-thin resist layers. The present invention will now be described with respect to the process flow of FIG. 3 and the cross-sectional views of FIGS. 4(a)–4(f).

Figure 3:
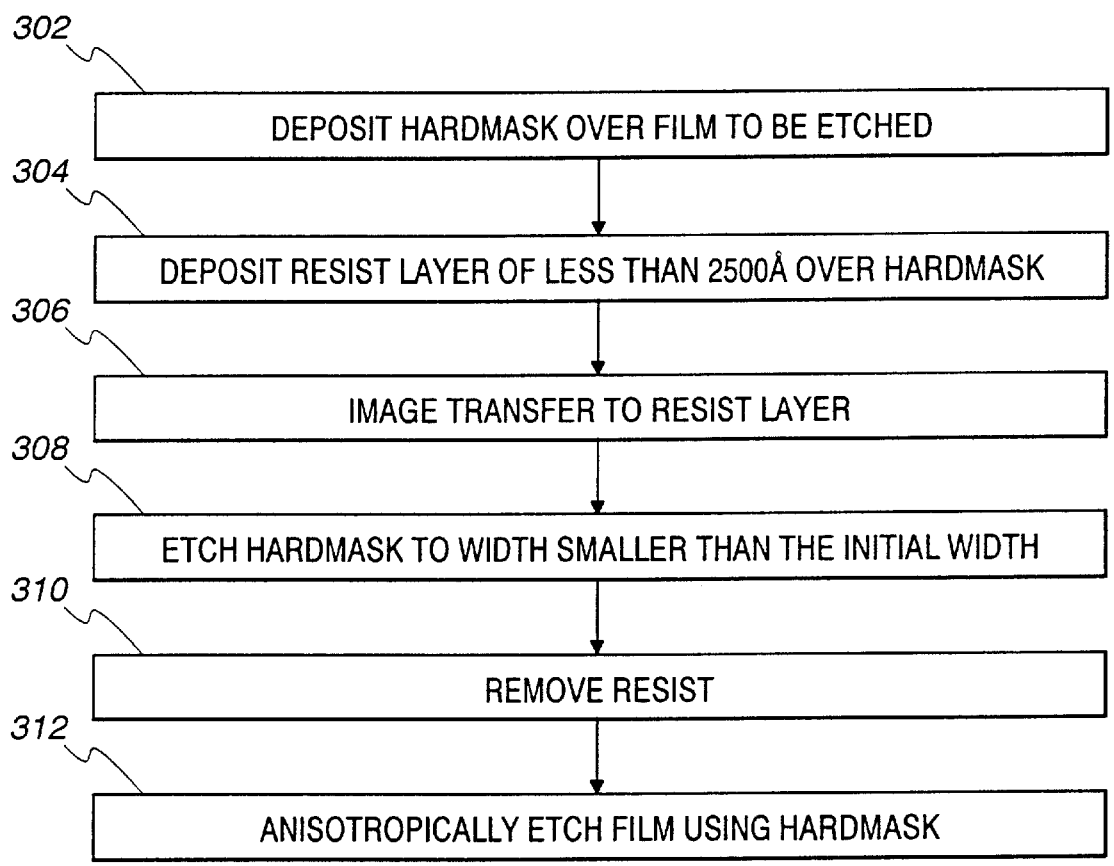
FIG. 3 is a process flow of the lithographic process in accordance with the principles of the present invention.
Figure 4A:
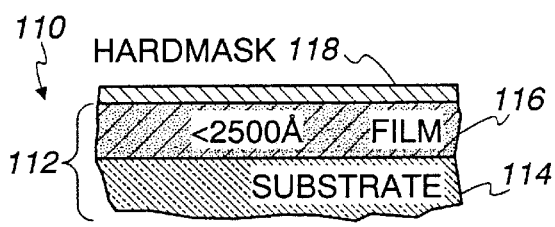
FIGS. 4(a)–4(f) illustrate cross-sectional views of the lithographic process of the present invention in FIG. 3.

In FIG. 4(a), there is shown a portion 110 of a semiconductor device being fabricated on a semiconductor wafer. The portion 110 includes a semiconductor wafer stack or film stack 112 formed of a substrate 114 and a gate conductive layer or device layer (film) 116. A hardmask layer 118 is deposited on top of the gate conductive layer or device layer 116 in accordance with step 302 of FIG. 3.

Figure 4E:
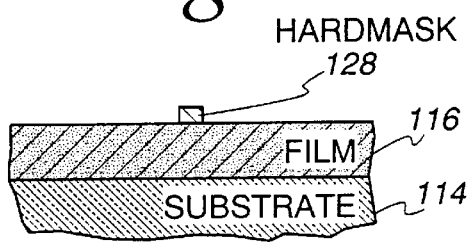
Figure 4B:
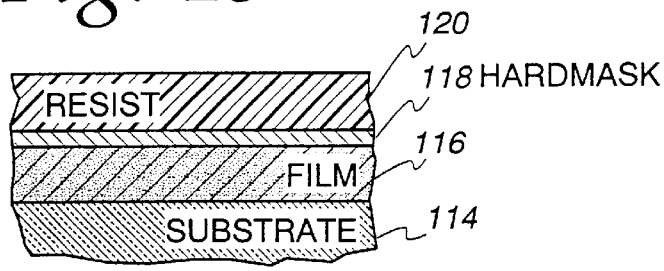

In FIG. 4(b), an UTR layer 120 is deposited on top of the hardmask layer 118 in accordance with the step 304 of FIG. 3. The gate conductive layer 116 is a layer of polycrystalline silicon having a thickness between 500 Å to 5000 Å. The materials for forming the hardmask layer 118 may be inorganic films such as silicon dioxide, silicon nitride, silicon oxynitride, and titanium nitride or organic films such as a bottom anti-reflective coating (BARC). The BARC is typically a water soluble fluoropolymer, such as Shipley AR19 which is commercially available from Shipley Corporation of Sunnyvale, Calif. The hardmask layer 118 has a thickness between 50 Å and 500 Å. The UTR layer 120 has a thickness of less than 2500 Å.

Figure 4F:
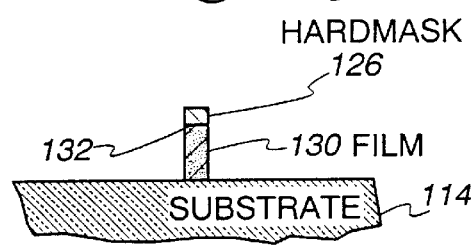
Figure 4C:
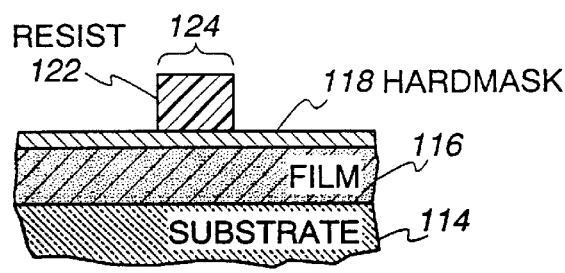
Figure 4D:
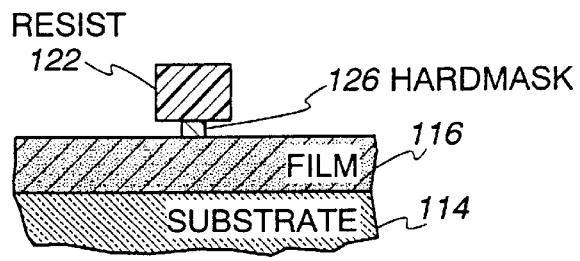

In FIG. 4(c), the UTR layer 120 is patterned to a resist mask 122 which has an initial linewidth 124. This corresponds to step 306 in FIG. 3. This initial linewidth is assumed to be the smallest dimension obtained by image transfer from the UTR layer in the lithographic equipment. In FIG. 4(d), corresponding to step 308 of FIG. 3, a hardmask trim etch process is performed which includes isotopically over-etching away exposed portions of the hardmask layer 118 as well as portions underneath the resist mask 122 so as to produce a hardmask 126. The hardmask 126 has a final linewidth 128 which is smaller than the initial linewidth 124 of the resist mask 122 and corresponds approximately to the desired gate or structure linewidth. By leaving the resist mask 122 during the hardmask trim, there is prevented the loss of material from the top of the hardmask 126.

In FIG. 4(e), the resist mask 122 is optionally removed. This corresponds to step 310 of FIG. 3. In FIG. 4(f), there is shown a gate conductive etching process in which exposed portions of the gate conductive layer or device layer 116 are etched away. The gate conductive etching process includes an anisotropic etching process which removes exposed portions of the conductive layer 116 and is stopped on the substrate 114. As a result, after the anisotropic etching a structure or gate 130 is formed which has a width 132 substantially equal to the hardmask final linewidth 128. Thus, the gate linewidth 132 is significantly smaller than what can be achieved by conventional UV lithographic equipment alone.

There are many modifications and variations which could be made to the present method while retaining the use of a hardmask so as to improve integration characteristics. For example, several modifications to the resist layer may include (1) a silylating resist layer could be used for improving selectivity to the hardmask layer, (2) the resist layer may be exposed to a UV bake before the hardmask etch so as to enhance selectivity to the hardmask layer, or (3) the resist layer could be cured by an electron beam before the hardmask etch in order to enhance selectivity to the hardmask layer. Electron beam and UV curing has the effect of breaking weak bonds in the polymer which will increase the etch resistance of the resist layer during the etching step. Such curing would be performed between the step of image transfer to the resist layer and the step of etching of the hardmask/conductive layer.

Further, variations to the hardmask layer could include (1) an organic or inorganic material may be used which minimizes reflection of the incident radiation during patterning of the resist layer, such as a bottom anti-reflective coating (BARC), (2) a composite (multi-layer) material may be used to absorb the incident radiation, or (3) a multi-layer material may be used consisting of a top anti-reflective layer such as a nitride film and a bottom etchstop layer such as an oxide film. In addition, modifications to the hardmask etch process may include a two-step process where (a) an anisotropic etch is performed initially so as to remove the exposed portions of the hardmask and (b) an isotropic etch is performed subsequently so as to reduce the lateral dimension of the hardmask underneath the resist mask. Moreover, the trim process could be provided into two parts: (a) isotropic etching is performed on the resist layer, and (b) etch and trim of the hardmask is then performed thereafter.

From the foregoing detailed description, it can thus be seen that the present invention provides an improved method of forming circuit structures having linewidths which are smaller than what is achievable by conventional UV lithographic techniques on ultra-thin resist layers. The method utilizes a hardmask which is patterned using a resist layer and is then trimmed to reduce the width of the hardmask layer before etching the underlying gate conductive layer.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method of forming circuit structures having linewidths which are smaller than what is achievable by conventional UV lithographic techniques on ultra-thin resist layers, said method comprising the steps of:
    providing a semiconductor wafer stack formed of a substrate and a device layer above the substrate;
    depositing a hardmask layer over the device layer;
    depositing an ultra-thin resist layer over the hardmask layer;
    forming a resist mask having an initial linewidth;
    anisotropically etching exposed portions of the hardmask layer;
    isotropically etching subsequently the hardmask layer underneath the resist mask to form a hardmask having a final linewidth which is narrower than the initial line width of the resist mask and corresponds to a desired structure linewidth; and
    anisotropically etching the device layer as defined by the hardmask to form a structure having a width substantially equal to the final linewidth of the hardmask.

2. A method of forming circuit structures as claimed in claim 1, wherein the device layer is formed of silicon.

3. A method of forming circuit structures as claimed in claim 2, wherein the silicon has a thickness between 500 Å to 5000 Å.

4. A method of forming circuit structures as claimed in claim 1, wherein the ultra-thin resist layer has a thickness of less than 2500 Å.

5. A method of forming circuit structures as claimed in claim 4, wherein the hardmask is made of an inorganic material.

6. A method of forming circuit structures as claimed in claim 5, wherein the inorganic material is one of silicon dioxide, silicon nitride, silicon oxynitride, and titanium nitride.

7. A method of forming circuit structures as claimed in claim 4, wherein the hardmask material is made of an organic material.

8. A method of forming circuit structures as claimed in claim 7, wherein the organic material is a bottom anti-reflective coating.

9. A method of forming circuit structures as claimed in claim 4, wherein the hardmask layer has a thickness between 50 Å to 500 Å.

10. A method of forming circuit structures as claimed in claim 1, further comprising the step of exposing the resist layer to a UV bake prior to the step of isotropic over-etching so as to enhance selectivity to the hardmask layer.

11. A method of forming circuit structures as claimed in claim 1, further comprising the step of curing the resist layer by an electron beam prior to the step of isotropic over-etching so as to enhance selectivity to the hardmask layer.

12. A method of forming circuit structures as claimed in claim 1, wherein the hardmask layer is formed of a multi-layer material.

13. A method of forming circuit structures as claimed in claim 12, wherein the multi-layer material consists of a top anti-reflective layer and a bottom etchstop layer.

14. A method of forming circuit structures as claimed in claim 13, wherein the top anti-reflective layer is formed of a nitride film.

15. A method of forming circuit structures as claimed in claim 14, wherein the bottom etchstop layer is formed of an oxide film.

16. A method of forming circuit structures as claimed in claim 1, wherein the resist mask used in the isotropic etching step is removed prior to the anisotropic etching step of the device layer.

17. A method of forming circuit structures as claimed in claim 1, wherein the resist mask used in the isotropic etching step is maintained on top of the hardmask during the anisotropic etching step of the device layer.

* * * * *